US010461727B1

(12) United States Patent
Hunter

(10) Patent No.: US 10,461,727 B1
(45) Date of Patent: Oct. 29, 2019

(54) SYSTEM AND METHOD FOR GENERATING PLURALITY OF SHORT RF PULSES

(71) Applicant: H6 SYSTEMS INC, Nashua, NH (US)

(72) Inventor: Michael William Hunter, Bedford, NH (US)

(73) Assignee: H6 SYSTEMS INC., Nashua, NH (US)

( * ) Notice: Subject to any disclaimer, the term of this patent is extended or adjusted under 35 U.S.C. 154(b) by 269 days.

(21) Appl. No.: 15/661,533

(22) Filed: Jul. 27, 2017

(51) Int. Cl.
*H03K 7/02* (2006.01)
*H01J 25/50* (2006.01)
*H03B 9/10* (2006.01)
*H03C 1/30* (2006.01)

(52) U.S. Cl.
CPC ................ *H03K 7/02* (2013.01); *H01J 25/50* (2013.01); *H03B 9/10* (2013.01); *H03C 1/30* (2013.01)

(58) Field of Classification Search
CPC .. H03K 7/02; H03C 1/30; H01J 25/50; H03B 9/10
See application file for complete search history.

(56) References Cited

U.S. PATENT DOCUMENTS

| 4,051,439 A | 9/1977 | Nyswander | |
| 2015/0245462 A1* | 8/2015 | Nighan, Jr. | ............. H05H 7/02 378/138 |

OTHER PUBLICATIONS

K. Harris et al., "600 kV Modulator Design for the SLAC Next Linear Collider Test Accelerator", Presented at the 1992 Twentieth International Power Modulator Symposium, Jun. 1992, 4 Pages [See Spec., p. 2].
J.T. Tymann et al., "Don't be fooled by risetime specs on pulsed microwave tubes. The Darlington modulator is the key to producing narrower pulses.", Electronic Design 17, Aug. 16, 1969, pp. 190-193.
K. Harris et al., "High Voltage Pulse Cable and Connector Experience in the Kicker Systems at SLAC", Presented at IEEE Particle Accelerator Conference, San Francisco, CA, May 6-9, 1991, pp. 1-3.
Nyswander et al., "Nanosecond Pulse Generators for Magnetron Operation", Naval Weapons Center, China Lake, CA, Nov. 1976, 7 pages.
High Frequency Magnetons, Electronic Design 17, Aug. 16, 1969, pp. 191-193 [See Spec., p. 2] [To Follow].

* cited by examiner

*Primary Examiner* — Jeffrey M Shin
(74) *Attorney, Agent, or Firm* — Davis & Bujold PLLC; Michael J. Bujold

(57) ABSTRACT

A system and method for generating a plurality of short RF pulses. The system and method comprises a first circuit comprising a first power supply and a plurality of first networks for generating a first output signal in a form of a high voltage pedestal pulse supplied to a common node, and a second circuit comprising a second power supply and a plurality of second networks for generating a second output signal in a form of a high voltage short pulse which is supplied to the common node. The pedestal pulse passes through a blocking inductor before being combined with the short pulse at the common node, and the short pulse is stacked on top of the pedestal pulse to form a combined high voltage pulse. A low frequency magnetron is coupled to the common node for receiving the stacked combined high voltage pulse and generating a short RF pulse.

20 Claims, 8 Drawing Sheets

|    | SHORT PULSE COMPONENT VALUES 4 NETWORKS | |     |
|----|------|-----|------|
|    | L    | C   |      |
|    | uH   | pf  |      |
| 44 | 1.41 | 444 | 46   |
| 44'| 4.22 | 148 | 46'  |
| 44"| 8.44 | 74  | 46"  |
| 44'''| 2.81 | 222 | 46''' |

|    | PEDESTAL PULSE COMPONENT VALUES 4 NETWORKS | |     |
|----|-------|-----|------|
|    | L     | C   |      |
|    | uH    | pf  |      |
| 44 | 2.81  | 889 | 46   |
| 44'| 8.44  | 296 | 46'  |
| 44"| 16.88 | 148 | 46"  |
| 44'''| 5.63 | 444 | 46''' |

FIG. 1A

| | SHORT PULSE COMPONENT VALUES 5 NETWORKS | | |
|---|---|---|---|
| | L | C | |
| | uH | pf | |
| 44 | 1.41 | 444 | 46 |
| 44' | 4.22 | 148 | 46' |
| 44" | 8.44 | 74 | 46" |
| 44'" | 14.06 | 44 | 46'" |
| 44"" | 2.81 | 222 | 46"" |

| | PEDESTAL PULSE COMPONENT VALUES 5 NETWORKS | | |
|---|---|---|---|
| | L | C | |
| | uH | pf | |
| 44 | 2.81 | 889 | 46 |
| 44' | 8.44 | 296 | 46' |
| 44" | 16.88 | 148 | 46" |
| 44'" | 28.13 | 89 | 46'" |
| 44"" | 5.63 | 444 | 46"" |

FIG. 5A

| | SHORT PULSE COMPONENT VALUES 6 NETWORKS | | |
|---|---|---|---|
| | L | C | |
| | uH | pf | |
| 44 | 1.41 | 444 | 46 |
| 44' | 4.22 | 148 | 46' |
| 44" | 8.44 | 74 | 46" |
| 44''' | 14.06 | 44 | 46''' |
| 44'''' | 21.09 | 30 | 46'''' |
| 44''''' | 2.81 | 222 | 46''''' |

| | PEDESTAL PULSE COMPONENT VALUES 6 NETWORKS | | |
|---|---|---|---|
| | L | C | |
| | uH | pf | |
| 44 | 2.81 | 889 | 46 |
| 44' | 8.44 | 296 | 46' |
| 44" | 16.88 | 148 | 46" |
| 44''' | 28.13 | 89 | 46''' |
| 44'''' | 42.19 | 59 | 46'''' |
| 44''''' | 5.63 | 444 | 46''''' |

FIG. 6A

SYSTEM AND METHOD FOR GENERATING PLURALITY OF SHORT RF PULSES

STATEMENT OF GOVERNMENT INTEREST

This invention was made with government support under Contract No. N00421-15-C-0035 awarded by the Naval Air Warfare Center AD-PAX Annex1 of Lexington Park Md., 20653-2058. The United States Government has certain rights in the inventions.

FIELD OF THE INVENTION

The present invention relates to the field of electronic transmitters and more specifically to magnetron transmitters and, in particular, to a method and a system of utilizing a low frequency magnetron in order to generate high powered microwaves which have very short duration of time of less than 130 nanoseconds.

BACKGROUND OF THE INVENTION

Aircraft designs have been, and are, making increased use of electrical and electronic systems to perform functions which may be necessary for the continued safe takeoff, flight, mission execution, and landing of the aircraft. The possible susceptibility of these systems to malfunction and/or failure, when exposed to High Power Microwaves (HPM), has resulted in the need to test the entire aircraft to HPM environments and ensure that the electrical and electronic systems are adequately shielded.

As is well known in the art, during operation, a magnetron will oscillate. High frequency tubes have a fast rise time requirement that actually is conducive to short pulses while low frequency magnetrons have a relatively slower rise time requirement. Accordingly, to achieve proper initiation of oscillation for a low frequency magnetron, typically the pulse applied by the modulator in the circuit must have a relatively slow rate of rise in the transition region, i.e., the region in which the magnetron begins to oscillate. If the applied pulse rises too rapidly in the critical region misfiring may occur, e.g., the tube may go into oscillation in the wrong mode. Any misfiring may be accompanied by a high voltage arc-over inside the tube.

It is to be appreciated that the requirement for a slowly rising modulator pulse is incompatible with the generation of a very short pulse. By using conventional techniques, it has never been possible to operate a magnetron with pulses as short as 40 nanoseconds, and for this reason pulse compression systems have been primarily used to obtain a high range resolution.

One known related prior art reference is U.S. Pat. No. 4,051,439 while a couple of other known related references include 600 *kV Modulator Design for the SLAC Next Linear Collider Test Accelerator*, K. Harris, J. de Lamare, V. Nesterov and R. Cassel, July 1992, 4 pages, and Don't be fooled by risetime specs on pulsed mircowave tubes. The Darlington modulator is the key to producing narrow pulses. J.T. Tymann et al., Electronic Design 17, Aug. 16, 1969, pages 191-193.

SUMMARY OF THE INVENTION

Wherefore, it is an object of the present invention to overcome the above mentioned shortcomings and drawbacks associated with the prior art in generating a 10-100 Hz pulse or a high powered microwave (HPM) with a relatively inexpensive low frequency magnetron.

Another object of the present invention is to utilize a low frequency magnetron to generate 10-100 Hz (short) pulses, of very short durations, e.g., between 40 and 100 nanoseconds, which are useful in determining whether or not a desired target, e.g, an electronic component(s) of an aircraft, is susceptible to interference or damage from short RF pulses.

A further object of the present invention is to generate both a high voltage pedestal pulse, via a first circuit of a system, and a high voltage short pulse, via a second circuit of the system, and then stack the high voltage short pulse on top of the high voltage pedestal pulse and thereafter utilize the pedestal portion, of this combined high voltage pulse, to oscillate the low frequency magnetron and, following sufficient oscillation of the low frequency magnetron, then utilize the high voltage short pulse to generate, within the low frequency magnetron, a short RF pulse and thereafter direct such short RF pulse at a desired object, e.g., an electronic component(s) of an aircraft.

Yet another object of the present invention is to initiate generation of the high voltage pedestal pulse but delay generation of the high voltage short pulse until shortly after the amplitude of the pedestal pulse reaches the Hartree voltage, i.e., typically about 70% of the amplitude of the combined high voltage pulse, so that the low frequency magnetron is caused to sufficiently resonate or oscillate prior to the short voltage pulse causing the low frequency magnetron to generate the high frequency short RF pulse.

A still further object of the present invention is to utilize a resonant charging component, located between the respective power supply and a respective Darlington Network or modulator, in order to minimize the overall size of the associated power supply while still permitting a relatively large voltage, e.g., between 2,000 and 60,000 volts, to be supplied to the Darlington Network or modulator and utilized to generate the high frequency short RF pulse.

Still another object of the present invention is to generate a combined signal in which a delay, between the time the high voltage pedestal pulse is generated and the time the high voltage short pulse is generated, is readily adjustable by the system and the amplitude of the combined high voltage pulse is substantially equal to, or slightly less than, the amplitude of the high voltage pedestal pulse plus the amplitude of the high voltage short pulse so that the high voltage short pulse is, in essence, stacked on top of the high voltage pedestal pulse.

Yet another object of the present invention is to control the amplitude of the pedestal pulse as well as control the amplitude of the high voltage short pulse so that the Hartree voltage of the tube can be found and matched as well as the maximum output capability of the tube.

A further object of the present invention is to provide a method and a system which is capable of generating a HPM source and facilitate testing of an electronic component(s), e.g., of an aircraft located on the ground or a rotatable pad or table, and subjected to the HPM source. It is to be appreciated that the low frequency magnetron operates at a single frequency but, if desired, the frequency can be adjusted to a different frequency or another frequency tube can be utilized.

The present invention also relates to a system for generating a plurality of short RF pulses for use in determining susceptibility of an electronic target to interference from microwaves, the system comprising: a first circuit comprising a first power supply and a plurality of first networks for generating a first output signal in a form of a high voltage pedestal pulse which is supplied to a common node; a second circuit comprising a second power supply and a plurality of second networks for generating a second output signal in a form of a high voltage short pulse which is supplied to the common node; the pedestal pulse passing through a blocking inductor and being combined with the high voltage short pulse such that the high voltage short pulse being stacked on top of the pedestal pulse to form a stacked combined high voltage pulse; and a low frequency magnetron being coupled to the common node for receiving the stacked combined high voltage pulse and generating a short RF pulse which has a duration of time which is less than 130 nanoseconds and useful in determining the susceptibility of an electronic target to interference from microwaves.

The present invention also relates to a method for generating a plurality of short RF pulses for use in determining a susceptibility of an electronic target to interference from microwaves, the method comprising: providing a first circuit comprising a first power supply and a plurality of first networks for generating a first output signal in a form of a high voltage pedestal pulse; supplying the high voltage pedestal pulse to a common node; providing a second circuit comprising a second power supply and a plurality of second networks for generating a second output signal in a form of a high voltage short pulse; supplying the high voltage short pulse to the common node; passing the high voltage pedestal pulse through a blocking inductor before combining the high voltage pedestal pulse with the high voltage short pulse at the common node and stacking the high voltage short pulse on top of the high voltage pedestal pulse to form a stacked combined high voltage pulse; coupling a low frequency magnetron to the common node for receiving the stacked combined high voltage pulse and energizing the low frequency magnetron; generating from the combined high voltage pulse, via the low frequency magnetron, a short RF pulse which has a duration of time which is less than 130 nanoseconds; and directing the short RF pulse at the electronic target to determine the susceptibility of the electronic target to interference from microwaves.

BRIEF DESCRIPTION OF THE DRAWINGS

The accompanying drawings, which are incorporated in and constitute a part of the specification, illustrate various embodiments of the invention and together with the general description of the invention given above and the detailed description of the drawings given below, serve to explain the principles of the invention. The invention will now be described, by way of example, with reference to the accompanying drawings in which:

FIG. 1A is a table indicating possible values for the various inductor and capacitor components of the first and the second circuits of the Darlington modulator as shown in FIG. 1;

FIG. 5A is a table indicating possible values for the various inductor and capacitor components of the first and the second circuits of the Darlington modulator as shown in FIG. 5;

FIG. 6A is a table indicating possible values for the various inductor and capacitor components of the first and the second circuits of the Darlington modulator as shown in FIG. 6;

It should be understood that the drawings are not necessarily to scale and that the disclosed embodiments are sometimes illustrated diagrammatical and in partial views. In certain instances, details which are not necessary for an understanding of this disclosure or which render other details difficult to perceive may have been omitted. It should be understood, of course, that this disclosure is not limited to the particular embodiments illustrated herein.

DETAILED DESCRIPTION OF THE PREFERRED EMBODIMENTS

The present invention will be understood by reference to the following detailed description, which should be read in conjunction with the appended drawings. It is to be appreciated that the following detailed description of various embodiments is by way of example only and is not meant to limit, in any way, the scope of the present invention.

High Voltage Short Pulses from Low Frequency Magnetrons

It is to be appreciated that in order to produce high voltage short pulses (20-100 nS) from a magnetron requires a voltage pulse with a relatively fast rise time. While higher frequency magnetrons, e.g., magnetron which oscillate at a frequency typically above 9 GHz, can readily accept such fast rise time, it is to be appreciated that lower frequency magnetrons, e.g., magnetron which oscillate at a frequency typically below 9 GHz, generally are unable to accept a voltage pulse with a relatively fast rise time. It is to be appreciated that the problem in which the low frequency magnetrons are generally unable to accept voltages pulses with a relatively fast rise time can be overcome by suitably shaping the voltage pulse to initially have a first relatively slow rise time, up to and through the low frequency magnetron's Hartree voltage region, which thereby allows the low frequency magnetron to be sufficiently energized and lock into its intended oscillating frequency. Once this intended frequency is locked in by the low frequency magnetron, thereafter, the voltage pulse can rise very quickly or rapidly, e.g., 5 to 60 nanoseconds or so depending upon the magnetron, and thereby produce and generate a narrow RF pulse from the low frequency magnetron.

The system 2 described below in further detail produces the proper voltage pulse shape with a number of distinct advantages. First of all, the system 2 does not require a pulse transformer so the overall system design is relatively low cost and is also relatively light weight and compact. It is forgiving for corona because it only reaches a high voltage for a very short duration of time, e.g., less than 100 nanoseconds, and at a low duty. In addition, the system 2 facilitates independent control and adjustment of the pulse voltages to match the Hartree voltage of the tubes and the peak operating voltage.

Theory of Operation

Figure 7:
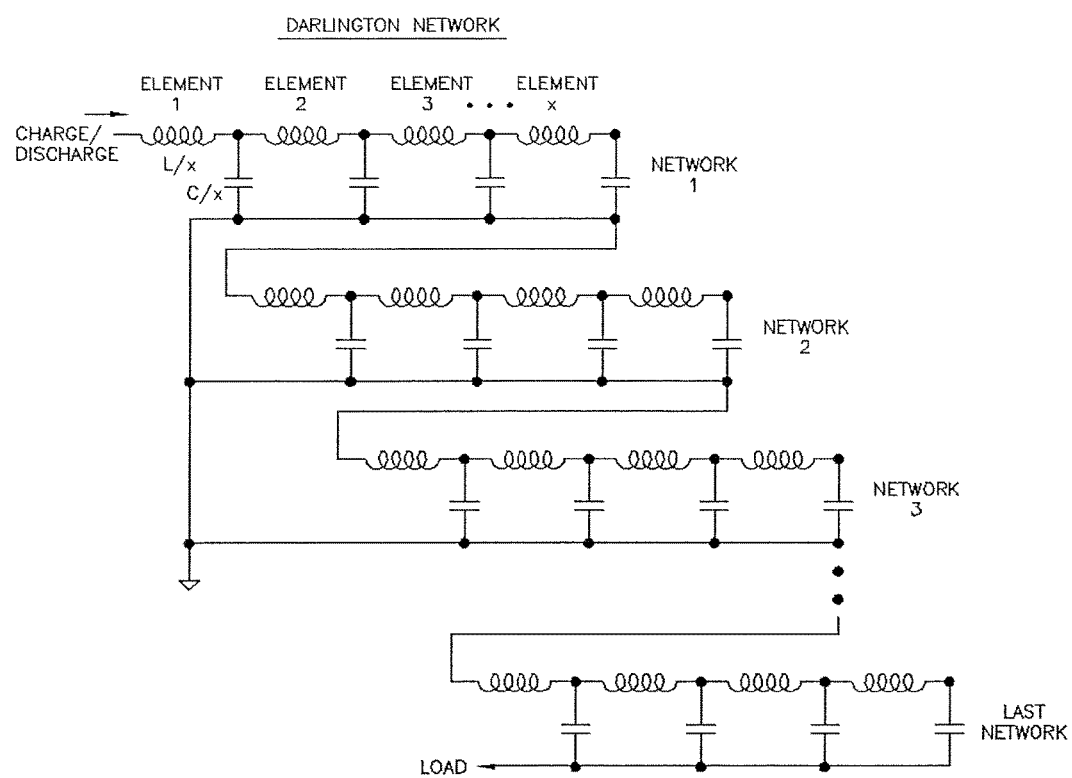
FIG. 7 is a diagram showing a conventional Darlington modulator which is known in the prior art.

Turning first to FIG. 7, as is well know in the art, a Darlington Network or modulator is a PFN (Pulse Forming Network) that increases a voltage output of the network. A conventional Darlington modulator may consist of a series of four-terminal pulse-forming networks. It is to be appreciated that all of the networks must have the same delay and phase characteristics in order for a single voltage pulse to result from the Darlington Network or modulator. The impedance of each of the four-terminal networks is given by the formulas:

$$Z_n = R(n(n+1)/N^2);$$

$$L = Z_n(PW/2);$$

$$C = PW/2(Z_n); \text{ and}$$

$$Z_{last} = R/N$$

Where:
R=load impedance;
$Z_n$=network impedance;
n=network # (1st or 2nd or 3rd or . . . );
N=number of networks including the last;
L=inductance;
C=capacitance;
PW=pulse width; and
$Z_{last}$=impedance of last network.

The schematic shown in FIG. 7 illustrates a generic or a conventional Darlington Network. Unlike other Pulse Forming Networks (PFNs) which reduce the voltage that is transferred to the load, the Darlington Network increases the voltage transferred by a factor related to the number of networks. However, it is to be appreciated that the voltage is increased with diminishing returns as the quantity of networks increases.

Figure 1:
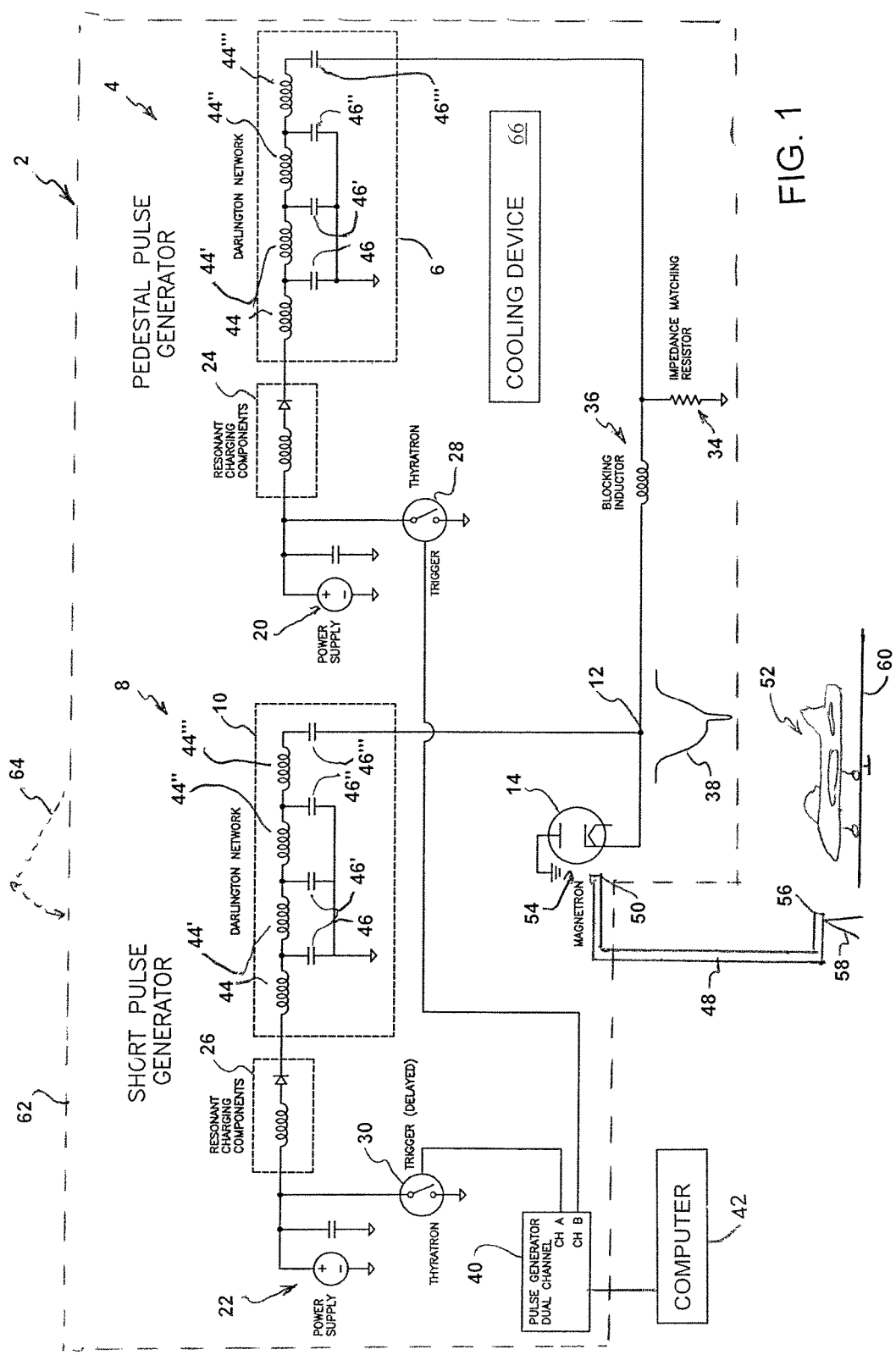
FIG. 1 is a diagrammatic schematic drawing showing the layout for a first embodiment of the present invention.

Turning now to FIGS. 1-4, application of the above briefly described Darlington Networks to the system 2 of the present invention will now be discussed. As generally shown in FIG. 1, the system 2 comprises a first circuit 4 which includes a first Darlington Network or modulator 6 and a second circuit 8 which includes a second Darlington Network or modulator 10. As indicated in FIG. 1A, each of the capacitors and inductors, forming the Darlington Networks or modulators 6, 10, typically have different values from one another. Each of the Darlington Networks or modulators 6, 10 of FIG. 1 comprise four connected networks. As diagrammatically shown, the respective outputs, from each of the first and the second circuits 4, 8, are subsequently combined with one another to form a combined signal 38 which is then supplied to the low frequency magnetron 14.

Figure 2:
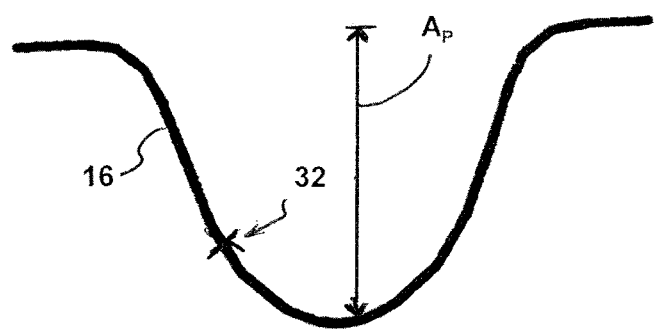
FIG. 2 is a diagrammatic representation showing a pedestal pulse generated by the first circuit.
Figure 3:
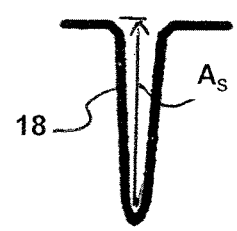
FIG. 3 is a diagrammatic representation showing a high voltage short pulse generated by the second circuit.

According the invention, the first circuit 4 is designed to produce a wider pulse (i.e., a high voltage pedestal pulse 16 as generally shown in FIG. 2) for initiating proper oscillation of the low frequency magnetron 14. The second circuit 8, on the other hand, is designed to produce a narrow pulse (i.e., a high voltage short pulse 18 as generally shown in FIG. 3) which is the pulse that is designed to generate the narrow RF pulse output which is outputted from the low frequency magnetron 14 and channeled or directed at the desired target 52, e.g., the electron equipment being tested to determine the susceptibility of the electronic components of an aircraft, for example, to interference from microwaves.

As shown in FIG. 1, in order to minimize the size of the respective power supplies 20, 22, the invention typically utilizes respective first and second resonant charging components 24, 26 which are designed to charge a voltage, to be supplied to the respective first or second circuit 4, 8, to a voltage which is typically twice the voltage supplied by the respective power supply 20, 22. The first circuit 4 is equipped with a first switch 28, e.g., a thyratron, while the second circuit 8 is equipped with a second switch 30, e.g., a thyratron, which allow independent triggering or firing of each one of the first and the second circuits 4, 8 to allow a timing adjustment between the time of generation of the high voltage pedestal pulse 16 (see FIG. 2) and the time of generation of the high voltage short pulse 18 (see FIG. 4) which are respectively generated by the first and the second circuits 4, 8, i.e., the switches control the delay between generation of each of these two pulses.

As is well known in the art, the low frequency magnetron 14 does not conduct current until the low frequency magnetron 14 is sufficiently energized so as that the magnetron exceeds its corresponding Hartree voltage 32, e.g., diagrammatically indicated in FIG. 2. A lack of load, by the low frequency magnetron 14, prior to this voltage typically causes a reflection of the high voltage pedestal pulse 16 back toward the first circuit 4 where the pulse is either dissipated as heat or eventually reflected back toward the low frequency magnetron 14. An impedance matching resistor 34 to ground is connected, along the first circuit 4, between the common node 12 and the output from the first Darlington Network or modulator 6 in order to minimize reflection of the high voltage pedestal pulse 16, from the low frequency magnetron 14, back toward the first circuit 4. This impedance matching resistor 34 operates to minimize any reflection of the high voltage pedestal pulse 16 back toward the first Darlington Network or modulator until the low frequency magnetron 14 is sufficiently conducting current.

A blocking inductor 36, or possibly a diode, is connected, along the first circuit 4, between the common node 12 and the impedance matching resistor 34. The blocking inductor 36 is utilized to combine the high voltage short pulse 18 with the high voltage pedestal pulse 16 so that the high voltage short pulse 18 is essentially stacked on top of the high voltage pedestal pulse 16, e.g., the combined high voltage pulse 38 has an amplitude $A_C$ which is substantially equal to, or slightly less than, the amplitude $A_P$ of the high voltage pedestal pulse 16 plus the amplitude $A_S$ of the high voltage short pulse 18 (see FIGS. 2-4). It is to be appreciated that a small portion of the high voltage short pulse 18 sinks or absorbs into the high voltage pedestal pulse 16 so that the amplitude $A_C$ of the combined high voltage pulse 38 is generally a little less than the amplitude $A_P$ of the high voltage pedestal pulse 16 plus the amplitude $A_S$ of the high voltage short pulse 18. The value of the blocking inductor 36 is selected so as to allow the relatively slower high voltage pedestal pulse 16 to pass through the blocking inductor 36 while blocking the high voltage short pulse 18 from passing in the opposite direction. The blocking inductor 36 thereby forces the voltage of the shorter pulse to be substantially added to the voltage of the high voltage pedestal pulse 16 and form a combined high voltage pulse 38 which has a voltage with an amplitude $A_C$ (see FIG. 4) that is substantially equal to the voltage amplitude $A_P$ of the high voltage pedestal pulse 16 plus the voltage amplitude $A_S$ of the high voltage short pulse 18.

DETAILED DESCRIPTION

Turning now to FIG. 1, a brief description concerning the various components of the present invention will now be briefly discussed. As generally shown in FIG. 1, and each of the first and second circuits 4, 8 generally comprises a respective power supply 20, 22. The first power supply 20 for the first circuit 4 generally comprises a power source capable of generating between 5,000 volts and 25,000 volts, e.g., typically about 7,000 volts, while the second power supply 22 for the second circuit 8 generally comprises a power source capable of generating between 5,000 volts and 25,000 volts, e.g., typically about 7,000 volts.

In addition, each of the first and the second circuits 4, 8 includes a respective resonant charging component 24, 26, e.g., such as a sequentially arranged inductor and a diode, which is located along the respective circuit between the respective power supply 20 or 22 and the respective Darlington Network or modulator 6, 10. Each of the first and the second respective resonant charging components 24, 26 typically has an inductance of between 0.25 and 50 Henrys (H). Each of the resonant charging components 24 or 26 facilitates a buildup of the voltage, supplied by the respective power supply 20 or 22, before that voltage is periodically released, e.g., every 1-100 nanoseconds or so, by the respective resonant charging component 24 or 26, to the respective Darlington Network or modulator 6 or 10. The first resonant charging component 24 is designed to increase the voltage, supplied by the first power supply 20, and thereby assist with minimizing the overall size of the first power supply 20 while the second resonant charging component 26 is designed to increase the voltage, supplied by the second power supply 22, and thereby assist with minimizing the overall size of the second power supply 22. That is, the respective first and second resonant charging components 24, 26 are utilized to charge the respective first and second Darlington Networks or modulators 6, 10 with a voltage which is typically twice the voltage supplied by the respective power supply 20, 22.

Figure 4:
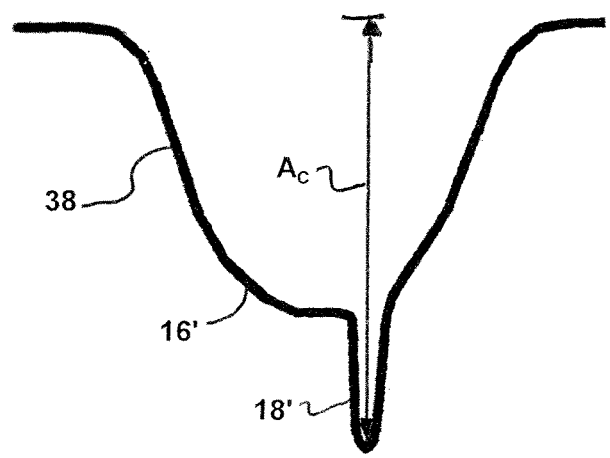
FIG. 4 is a diagrammatic representation showing a combined high voltage pulse which results from the high voltage short pulse being stacked on top of the pedestal pulse.

As shown in FIG. 1, the system 2 also includes a first triggering device 28, e.g., thyratron, which is electrically connected to the first circuit 4 at a location typically between the first power supply 20 and the first resonant charging component 24 and a second (delay) triggering device 30, e.g., thyratron, which is electrically connected to the second circuit 8 at a location typically between the second power supply 22 and the second resonant charging component 26. Each one of the first triggering device 28 and the second (delay) triggering device 30 is respectively electrically connected to a pulse generator dual channel 40 which is electrically connected to a computer 42 for controlling operation of the system 2. As shown, the first triggering device 28 is coupled to a first channel, e.g., channel B, of the pulse generator dual channel 40 while the second (delay) triggering device 30 is coupled to a second channel, e.g., channel A, of the pulse generator dual channel 40. This arrangement facilitates selective individual triggering, by the computer 42, of each of the first and the second triggering devices 28, 30 at desired sequential times which, in turn, facilitates stacking of the high voltage short pulse 18 on top of the high voltage pedestal pulse 16, as discussed below in further detail, in a desired time sequence to form the combined high voltage pulse 38. That is, the resulting voltage of the combined high voltage pulse 38, as shown in FIG. 4, has an amplitude $A_C$ which is substantially equal, or typically slightly less than, to the amplitude $A_P$ of the high voltage pedestal pulse 16, as shown in FIG. 2, plus the amplitude $A_S$ of the high voltage short pulse 18, as generally shown in FIG. 3.

The first Darlington Network or modulator 6, as shown in FIG. 1, generally comprises an arrangement or an array of four separate and distinct inductors 44, 44', 44", 44''' which are arranged in series with one another. Between each one of the adjacent networks, forming the first Darlington Network or modulator 6, a connection to ground is provided through a respective capacitor 46, 46', 46", 46'''. Each one of these capacitors 46, 46', 46", 46''' has a capacitance of between 1 and 10,000 picofarads (pF), for example, and typical values for the capacitors 46, 46', 46", 46''' are indicated in FIG. 1A. The generated signal, which flows from the last network of the first Darlington Network or modulator 6, passes through the last or exit capacitor 46''' of the first Darlington Network or modulator 6 and this signal forms the output from the first Darlington Network or modulator 6 which is, in turn, the high voltage pedestal pulse 16 from the first circuit 4 which flows toward the common node 12. The generated signal, which flows from the last network of the second Darlington Network or modulator 10, passes through the last or exit capacitor 46''' of the second Darlington Network or modulator 10 and this signal forms the output from the second Darlington Network or modulator 10 which is, in turn, the high voltage short pulse 18 from the second circuit 8 which flows toward the common node 12.

As is well known in the art, the low frequency magnetron 14 does not conduct current until the low frequency magnetron 14 exceeds its corresponding Hartree voltage 32. As shown in FIG. 1, the impedance matching resistor 34 is electrically connected along an electrical wire of the first circuit 4 which extends and couples the first Darlington Network or modulator 6 to the common node 12. As noted above, the impedance matching resistor 34 is designed to avoid reflection of the high voltage pedestal pulse 16 back along the first circuit 4 toward the first Darlington Network or modulator 6 and the first power supply 20. The impedance matching resistor 34 is grounded and thus operates, in a conventional manner, to minimize any reflection of the high voltage pedestal pulse 16, generated by the first circuit 4, until the low frequency magnetron 14 is sufficiently energized and oscillating and, therefore, able to receive a voltage pulse having a relatively fast rise time.

In addition, the blocking inductor 36 is electrically connected between the impedance matching resistor 34 and the common node 12. The value of the blocking inductor 36 is selected so as to allow the slower high voltage pedestal pulse 16 to pass therethrough while blocking or preventing the high voltage short pulse 18 from passing through the blocking inductor 36, in the opposite direction, and flowing toward the first circuit 4. As noted above, the blocking inductor 36 induces or causes the voltage of the shorter pulse 18 to be combined or added to, e.g., stacked on top of, the voltage of the high voltage pedestal pulse 16 and thereby form the combined high voltage pulse 38 with a voltage which has an amplitude $A_C$ which is substantially equal to the amplitude $A_P$ of the high voltage pedestal pulse 16 plus the amplitude $A_S$ of the high voltage short pulse 18.

As noted above, the high voltage pedestal pulse 16 and the high voltage short pulse 18 are combined with one another at the common node 12 and the combined high voltage pulse 38 then flows, from the common node 12 toward the low frequency magnetron 14. A first portion of the combined high voltage pulse 38, which is supplied to the low frequency magnetron 14, is utilized to excite the low frequency magnetron 14. That is, the high voltage pedestal pulse portion 16', which is generated by the first circuit 4, initially excites the low frequency magnetron 14 and the voltage, of the high voltage pedestal pulse portion 16' of the combined high voltage pulse 38, energizes the low frequency magnetron 14 and eventually exceeds Hartree voltage 32 of the low frequency magnetron 14. As soon as this occurs, the low frequency magnetron 14 is sufficiently energized and, thereafter, locks into its intended oscillating frequency. The voltage, of the high voltage pedestal pulse portion 16' of the combined high voltage pulse 38, continues to rise or increase (see FIG. 4), e.g., for an additional 1 to 300 nanoseconds or so, which induces continued oscillation of the low frequency magnetron 14. Finally, the high voltage short pulse portion 18' of the combined high voltage pulse 38 is then received, by the low frequency magnetron 14, and utilized to raise the low frequency magnetron 14 to full conduction (or output power), e.g., supply the low frequency magnetron 14 with a voltage pulse having a relatively fast rise time, and thereby cause the low frequency magnetron 14 to generate an RF pulse output which is directed at a desired target 52, e.g., electronic equipment of an aircraft to be tested.

It is to be appreciated that it is desirable to minimize the amount of voltage supplied above the Hartree voltage. This results in a better defined short RF pulse. Ideally, the Hartree voltage 32 for the low frequency magnetron 14, as diagrammatically shown in FIG. 2, would be located closer to the peak of the pulse. The Hartree voltage is typically at about 70% of the full voltage while the high voltage short pulse would comprise the final 30% of the voltage.

As diagrammatically shown in FIG. 1, a flexible transmission duct or line 48 for receiving the generated RF pulse has an inlet end 50, located adjacent an output section 54 of the low frequency magnetron 14, in order to receive, channel and facilitate redirecting of the generated RF pulse along the length of the flexible transmission duct or line 48 and emit the generated RF pulse from a remote free end or antenna 56 toward the desired target 52, e.g, the desired electronic component(s). The remote free end or antenna 56 of the flexible transmission duct or line 48 may be supported, for example, on an adjustable tripod or some other adjustable stand 58 which facilitates manipulation and directing of the generated RF pulse at a desired area or region of the desired target 52. The cross sectional shape of the flexible transmission duct or line 48 may be cylindrical, rectangular or elliptical, for example, and typically has a maximum dimension of a few inches to one foot or so and a length of between about five feet to fifty feet or so. The flexible transmission duct or line 48 is designed to receive the generated RF pulse, at the inlet end 50 thereof, and channel and guide the generated RF pulse along the length of the flexible transmission duct or line 48 and then emit the generated RF pulse out from the remote free end or antenna 56 toward the desired target 52.

As diagrammatically shown in FIG. 1, the desired target 52, e.g., the electronic components of the aircraft to be tested, may be situated or supported on a rotatable pad or table 60 which rotates a relatively slow speed, e.g., typically less than a few revolutions per minute. Alternatively, the desired target 52, e.g., the electronic components of the aircraft to be tested, may be situated or supported on a stationary surface, e.g., the ground, and the remote free end or antenna 56 of the flexible transmission duct or line 48, supported by the adjustable stand 58, is periodically moved, in a circumferentially pattern, around a perimeter of the desired target 52, e.g., the electronic component(s) of the aircraft to be tested, for determining the susceptibility of the desired target 52, from a plurality of different angles or positions, to interference from microwaves.

The entire system 2, except for the inlet end 50 of the flexible transmission duct or line 48, is fully enclosed within an exterior housing 62 which is designed to permit access to the interior thereof while also preventing the accumulation of dust therein. The housing 62 typically includes one or more lockable doors 64 (only diagrammatically shown) which provide access to the interior components of the system 2 so as to facilitate access, maintenance and/or repair of the system 2. Due to the high voltage of the system 2, the interior space or chamber is typically enclosed by the housing 62 may possibly be cooled to prevent overheating of the components of the system 2. If desired or necessary, a relatively small cooling device or heat exchanger 66 (only diagrammatically shown) may be provided to satisfy the cooling requirements of the system 2. Where necessary or desired, ambient and forced air can also be used to cool the components of the system 2 which are housed within the housing 62.

Figure 5:
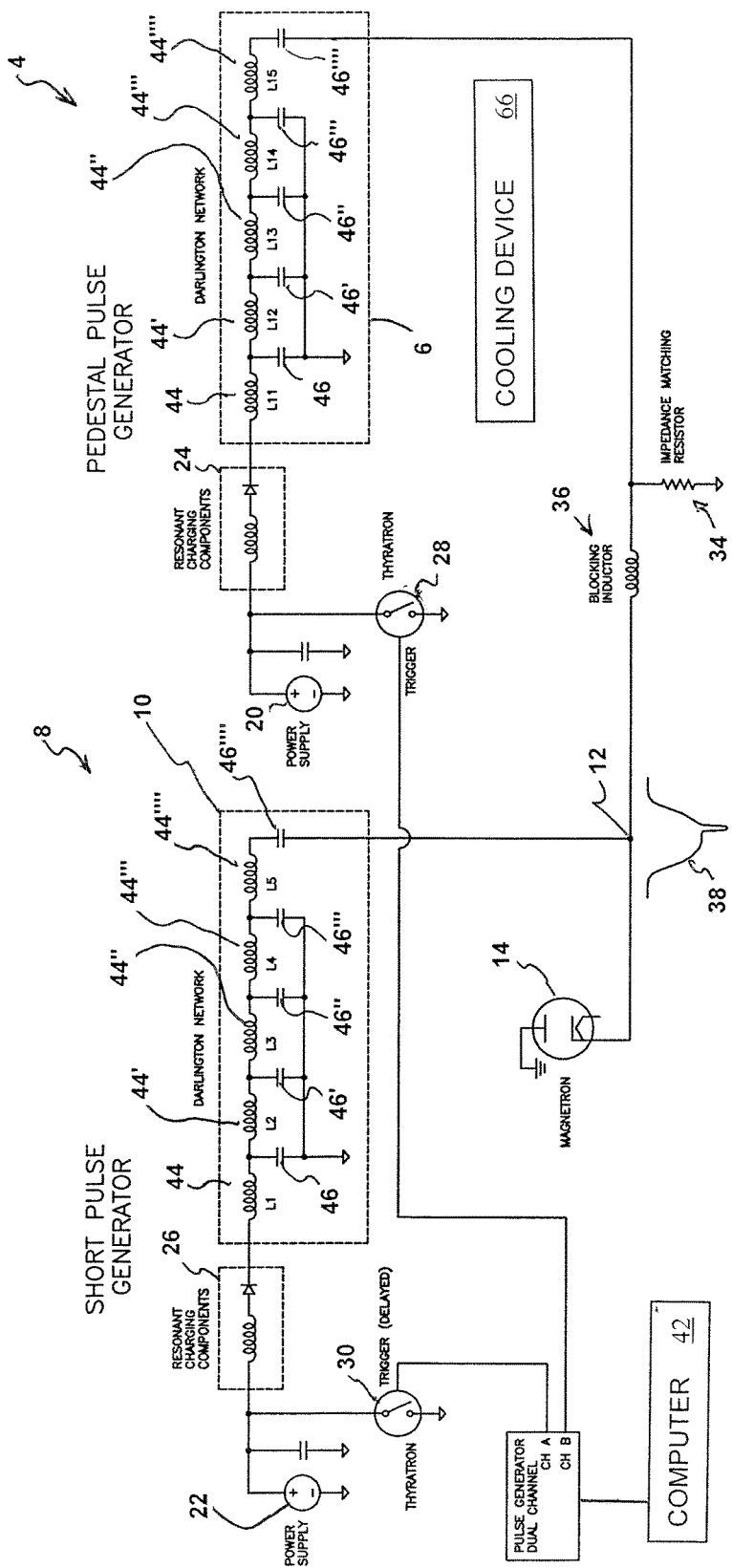
FIG. 5 is a diagrammatic schematic drawing showing the layout for another embodiment of the present invention where each of the first and second circuits comprises five sequential networks.

Turning now to FIGS. 5 and 5A, a second embodiment of the present invention will now be described. As this embodiment is very similar to the previously discussed embodiment, only the differences between this new embodiment and the previous embodiment will be discussed in detail while identical elements will be given identical reference numerals.

The basic difference between this embodiment and the previous embodiment is that each of the Darlington Networks or modulators 6, 10, shown in FIG. 5, has a total of five pulse-forming networks which are arranged in series with one another. The depicted inductors 44, 44', 44", 44'", 44"" and capacitors 46, 46', 46", 46'", 46"" forming the respective Darlington Networks or modulators 6, 10 of FIG. 5, may have values indicated in FIG. 5A.

The generated signal, which flows from the last network of the first Darlington Network or modulator 6, passes through the last or exit capacitor 46"" of the first Darlington Network or modulator 6 and this signal forms the output from the first Darlington Network or modulator 6 which is, in turn, the high voltage pedestal pulse 16 from the first circuit 4 which flows toward the common node 12. The generated signal, which flows from the last network of the second Darlington Network or modulator 10, passes through the last or exit capacitor 46"" of the second Darlington Network or modulator 10 and this signal forms the output from the second Darlington Network or modulator 10 which is, in turn, the high voltage short pulse 18 from the second circuit 8 which flows toward the common node 12.

Figure 6:
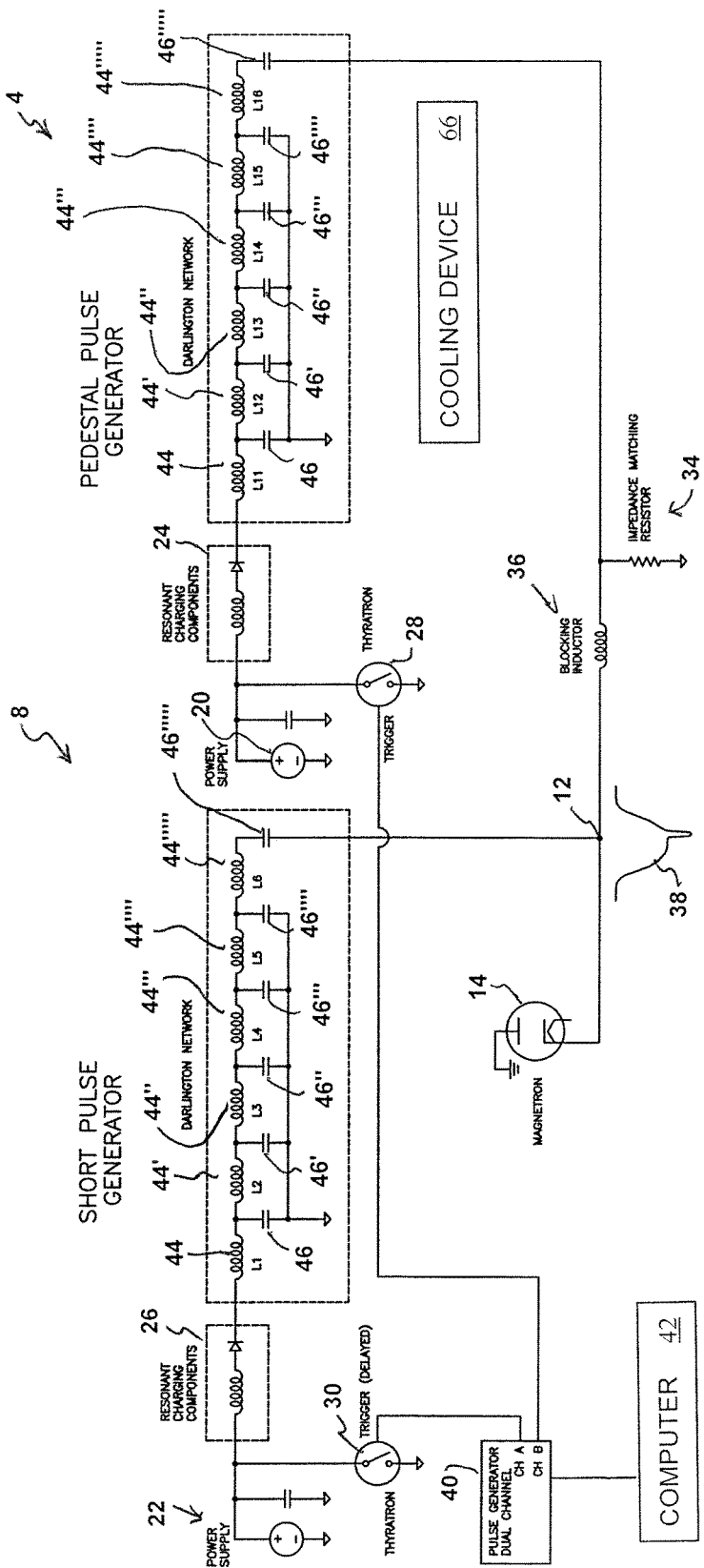
FIG. 6 is a diagrammatic schematic drawing showing the layout for another embodiment of the present invention where each of the first and second circuits comprises six sequential networks.

Turning now to FIGS. 6 and 6A, a third embodiment of the present invention will now be described. As this embodiment is very similar to both of the previously discussed embodiments, only the differences between this new embodiment and the two previous embodiments will be discussed in detail while identical elements will be given identical reference numerals.

The basic difference between this third embodiment and the previous embodiments is that each of the Darlington Networks or modulators 6, 10, shown in FIG. 6, has a total of six pulse-forming networks which are arranged in series with one another. The depicted inductors 44, 44', 44", 44'", 44"", 44 and capacitors 46, 46', 46", 46'", 46"", 46 forming the respective Darlington Networks or modulators 6, 10 of FIG. 5, may have values indicated in FIG. 6A.

The generated signal, which flows from the last network of the first Darlington Network or modulator 6, passes through the last or exit capacitor 46 of the first Darlington Network or modulator 6 and this signal forms the output from the first Darlington Network or modulator 6 which is, in turn, the high voltage pedestal pulse 16 from the first circuit 4 which flows toward the common node 12. The generated signal, which flows from the last network of the second Darlington Network or modulator 10, passes through the last or exit capacitor 46 of the second Darlington Network or modulator 10 and this signal forms the output from the second Darlington Network or modulator 10 which is, in turn, the high voltage short pulse 18 from the second circuit 8 which flows toward the common node 12.

While various embodiments of the present invention have been described in detail, it is apparent that various modifications and alterations of those embodiments will occur to and be readily apparent to those skilled in the art. However, it is to be expressly understood that such modifications and alterations are within the scope and spirit of the present invention, as set forth in the appended claims. Further, the invention(s) described herein is capable of other embodiments and of being practiced or of being carried out in various other related ways. In addition, it is to be understood that the phraseology and terminology used herein is for the purpose of description and should not be regarded as limiting. The use of "including," "comprising," or "having," and variations thereof herein, is meant to encompass the items listed thereafter and equivalents thereof as well as additional items while only the terms "consisting of" and "consisting only of" are to be construed in a limitative sense.

The foregoing description of the embodiments of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

Wherefore, I claim:

1. A system for generating a plurality of short RF pulses for use in determining susceptibility of an electronic target to interference from microwaves, the system comprising:
   a first circuit comprising a first power supply and a plurality of first networks for generating a first output signal in a form of a high voltage pedestal pulse which is supplied to a common node;
   a second circuit comprising a second power supply and a plurality of second networks for generating a second output signal in a form of a high voltage short pulse which is supplied to the common node;
   the high voltage pedestal pulse passing through a blocking inductor and being combined with the high voltage short pulse such that the high voltage short pulse being stacked on top of the high voltage pedestal pulse to form a stacked combined high voltage pulse; and
   a low frequency magnetron being coupled to the common node for receiving the stacked combined high voltage pulse and generating a short RF pulse which has a duration of time which is less than 130 nanoseconds and useful in determining the susceptibility of an electronic target to interference from microwaves.

2. The system according to claim 1, wherein the first circuit further comprises a first switch which facilitates triggering of the first circuit, and the second circuit comprises a second switch which facilitates triggering of the second circuit.

3. The system according to claim 2, wherein the system further includes a computer for controlling actuation of the first switch and triggering of the first circuit, and for controlling actuation the second switch and triggering of the second circuit independently of the triggering of the first circuit.

4. The system according to claim 1, wherein an impedance matching resistor is located between the output of the first circuit and the blocking inductor.

5. The system according to claim 1, wherein the first circuit further comprises a first resonant charging component, located between the first power supply and the plurality of first networks, for increasing a voltage supplied by the first power supply to the plurality of first networks, and a second resonant charging component, located between the second power supply and the plurality of second networks, for increasing a voltage supplied by the second power supply to the plurality of second networks.

6. The system according to claim 3, wherein the computer facilitates adjustment of an amplitude of the high voltage pedestal pulse generated by the first circuit so that a voltage of the high voltage pedestal pulse of the first circuit is sufficient to oscillate the low frequency magnetron.

7. The system according to claim 3, wherein the computer facilitates adjustment of an amplitude of the high voltage pedestal pulse generated by the first circuit so that a voltage of the high voltage pedestal pulse of the first circuit is sufficient to oscillate the low frequency magnetron, and the computer delays the second switch from triggering of the second circuit for a time period of between 5 and 200 nanoseconds after triggering of the first circuit by the first switch.

8. The system according to claim 1, wherein the first circuit comprises a first Darlington modulator which comprises between three and six networks, and the second circuit comprises a second Darlington modulator which comprises between three and six networks.

9. The system according to claim 1, wherein the first circuit comprises a first Darlington modulator which comprises four networks, and the second circuit comprises a second Darlington modulator which comprises four networks.

10. The system according to claim 1, wherein the first circuit comprises a first Darlington modulator which comprises five networks, and the second circuit comprises a second Darlington modulator which comprises five networks.

11. The system according to claim 1, wherein the first circuit comprises a first Darlington modulator which comprises six networks, and the second circuit comprises a second Darlington modulator which comprises six networks.

12. The system according to claim 1, wherein each of the first and the second power supplies has an output voltage of between 5,000 and 25,000 volts.

13. The system according to claim 1, wherein the system generates between 10 and 100 short RF pulses per second.

14. The system according to claim 1, wherein each short RF pulse has a duration of between 9 and 130 nanoseconds.

15. The system according to claim 1, wherein the combined high voltage pulse has a duration of between 0.1 and 1.0 microseconds and a peak voltage of between 2,000 volts to 60,0000 volts.

16. The system according to claim 1, wherein a first end of a flexible transmission line, for receiving the generated RF pulse, is arranged to receive the generated RF pulse from the low frequency magnetron and emit the generated RF pulse from a remote antenna of the flexible transmission line toward the electronic target.

17. The system according to claim 16, wherein the remote second end of the flexible transmission line is supported by an adjustable stand which facilitates manipulation and directing of the generated RF pulse at a desired area of the electronic target.

18. The system according to claim 16, wherein an exterior housing encloses the system, except for the flexible transmission line, and housing includes one or more lockable doors which provide access to components of the system, and a cooling device cools an interior space enclosed by the housing to prevent overheating of the components of the system.

19. The system according to claim 1, wherein the electronic target is an electronic component of an aircraft.

20. A method for generating a plurality of short RF pulses for use in determining a susceptibility of an electronic target to interference from microwaves, the method comprising:
providing a first circuit comprising a first power supply and a plurality of first networks for generating a first output signal in a form of a high voltage pedestal pulse;
supplying the high voltage pedestal pulse to a common node;
providing a second circuit comprising a second power supply and a plurality of second networks for generating a second output signal in a form of a high voltage short pulse;
supplying the high voltage short pulse to the common node;
passing the high voltage pedestal pulse through a blocking inductor before combining the high voltage pedestal pulse with the high voltage short pulse at the common node and stacking the high voltage short pulse on top of the high voltage pedestal pulse to form a stacked combined high voltage pulse;
coupling a low frequency magnetron to the common node for receiving the stacked combined high voltage pulse and energizing the low frequency magnetron;
generating from the combined high voltage pulse, via the low frequency magnetron, a short RF pulse which has a duration of time which is less than 130 nanoseconds; and
directing the short RF pulse at the electronic target to determine the susceptibility of the electronic target to interference from microwaves.

* * * * *